(12) United States Patent
Takeda et al.

(10) Patent No.: US 8,426,983 B2
(45) Date of Patent: Apr. 23, 2013

(54) SEMICONDUCTOR DEVICE

(75) Inventors: Hiromasa Takeda, Tokyo (JP); Satoshi Isa, Tokyo (JP); Mitsuaki Katagiri, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 84 days.

(21) Appl. No.: 13/014,235

(22) Filed: Jan. 26, 2011

(65) Prior Publication Data
US 2011/0180934 A1 Jul. 28, 2011

(30) Foreign Application Priority Data

Jan. 28, 2010 (JP) .................. 2010-016928

(51) Int. Cl.
*H01L 23/48* (2006.01)
(52) U.S. Cl.
USPC ........... 257/784; 257/773; 257/782; 257/783; 257/E23.01; 257/E23.023; 257/E23.024; 257/E23.079; 257/E23.177; 174/255; 174/260; 361/767; 361/768; 361/783
(58) Field of Classification Search ............ 257/773, 257/782, 783, 784, E23.01, E23.023, E23.024, 257/E23.079, E23.177; 174/255, 260; 361/767, 361/768, 783
See application file for complete search history.

(56) References Cited

U.S. PATENT DOCUMENTS 7,214,566 B1 * 5/2007 Wood et al. ............... 438/110
7,323,772 B2 * 1/2008 Morrison .................. 257/692
2004/0113250 A1 * 6/2004 Khandros et al. ......... 257/680

FOREIGN PATENT DOCUMENTS
JP 2008-198841 A 8/2008

OTHER PUBLICATIONS

Machine English Translation of JP 2008-198841, obtained Jun. 13, 2012.*

* cited by examiner

*Primary Examiner* — Peniel M Gumedzoe
(74) *Attorney, Agent, or Firm* — Foley & Lardner LLP

(57) ABSTRACT

A semiconductor device may include: first and second wiring boards separated from each other via a gap; a semiconductor chip; first and second groups of electrode pads; and first and second groups of connection pads. The semiconductor chip is fixed to upper surfaces of the first and second wiring boards, and has a first portion adjacent to the gap. The first and second groups of electrode pads are disposed on the first portion. The first and second groups of electrode pads are aligned adjacent to side surfaces of the first and second wiring boards, respectively. The side surfaces of the first and second wiring boards face each other. The first and second groups of connection pads are disposed on lower surfaces of the first and second wiring boards, respectively. The first and second groups of connection pads are aligned adjacent to the side surfaces of the first and second wiring boards, respectively.

22 Claims, 13 Drawing Sheets

SEMICONDUCTOR DEVICE

BACKGROUND OF THE INVENTION

1. Field of the Invention

The present invention relates to a semiconductor device including a semiconductor chip over an insulating substrate.

Priority is claimed on Japanese Patent Application No. 2010-016928, filed Jan. 28, 2010, the content of which is incorporated herein by reference.

2. Description of the Related Art

Recently, with the higher integration of semiconductor chips, miniaturization of wires has progressed, and multilayered wiring structures have been provided. On the other hand, the package size has to be decreased for more-densely mounting of semiconductor devices. Regarding a semiconductor package, such as a BGA (Ball Grid Array) and a CSP (Chip Size Package), an insulating board and a semiconductor chip on the insulating board are connected by wire-bonding or the like.

Japanese Patent Laid-Open Publication No. 2008-198841 discloses a BGA semiconductor device. Specifically, a wiring board has a rectangular hole in the center region. A semiconductor chip is disposed on the wiring board so as to cover the rectangular hole. Multiple electrode pads are aligned in two lines on the center region of the rear surface of the semiconductor chip. The electrode pads are exposed to the rectangular hole. Multiple connection pads are provided on the rear surface of the wiring board. The connection pads are connected to the electrode pads by wires.

It is easy to connect the electrode pads to the connection pads arranged along one side surface of the hole which is closer to the electrode pads. However, it is difficult to connect the electrode pads to the connection pads arranged along the other side surface of the hole, thereby requiring long wire routing. When the electrode pads are connected using wires to the connection pads arranged along the other side surface of the hole, the distance between the wires and adjacent wires decreases, thereby causing wire a short-circuit when the wires are deformed by flow deformation of a sealing resin and the like.

SUMMARY

In one embodiment, a semiconductor device may include, but is not limited to: a first wiring board; a second wiring board; a semiconductor chip; a first group of electrode pads; a second group of electrode pads; and a first group of connection pads. The first wiring board has a first surface, a second surface, and a side surface. The second surface opposes the first surface. The second wiring board is separated from the first wiring board via a gap. The second wiring board has a first surface, a second surface, and a side surface. The second surface opposes the first surface. The side surface of the second wiring board faces the side surface of the first wiring board. The semiconductor chip is fixed to the first surface of the first wiring board and the first surface of the second wiring board. The semiconductor chip has a first portion adjacent to the gap. The first group of electrode pads is disposed on the first portion. The first group of electrode pads is aligned adjacent to the side surface of the first wiring board. The second group of electrode pads is disposed on the first portion. The second group of electrode pads is aligned adjacent to the side surface of the second wiring board. The first group of connection pads is disposed on the second surface of the first wiring board. The first group of connection pads is aligned adjacent to the side surface of the first wiring board. The second group of connection pads is disposed on the second surface of the second wiring board. The second group of connection pads is aligned adjacent to the side surface of the second wiring board.

In another embodiment, a semiconductor device may include, but is not limited to: a wiring board; a semiconductor chip; a first group of electrode pads; and a second group of electrode pads. The wiring board has a center region that has a slit. The wiring board has first and second surfaces. The slit has a first side surface and a second side surface opposing the first side surface. The semiconductor chip is fixed to the first surface of the wiring board. The semiconductor chip has a first portion adjacent to the slit. The first group of electrode pads is disposed on the first portion. The first group of electrode pads is aligned adjacent to the first side surface of the slit. The first group of electrode pads includes a first electrode pad. The second group of electrode pads is disposed on the first portion. The second group of electrode pads is aligned adjacent to the second side surface of the slit. The first group of connection pads is disposed on the second surface of the wiring board. The first group of connection pads is aligned adjacent to the first side surface of the slit. The first group of connection pads includes first and second connection pads. The first connection pad is electrically connected to the first electrode pad through a first wire that extends through the slit. The second connection pad is electrically connected to the first connection pad through a wiring. The second group of connection pads is disposed on the second surface of the wiring board. The second group of connection pads is aligned adjacent to the second side surface of the slit.

In another embodiment, a semiconductor device may include, but is not limited to: a wiring board; a semiconductor chip; a first group of electrode pads; a second group of electrode pads; a first group of connection pads; and a second group of connection pads. The wiring board has a center region that has a slit. The wiring board has first and second surfaces. The slit has a first side surface and a second side surface opposing the first side surface. The semiconductor chip is fixed to the first surface of the wiring board. The semiconductor chip has a first portion adjacent to the slit. The first group of electrode pads is disposed on the first portion. The first group of electrode pads is aligned adjacent to the first side surface of the slit. The first group of electrode pads includes a first electrode pad. The second group of electrode pads is disposed on the first portion. The second group of electrode pads is aligned adjacent to the second side surface of the slit. The first group of connection pads is disposed on the second surface of the wiring board. The first group of connection pads is aligned adjacent to the first side surface of the slit. The first group of connection pads includes a first connection pad electrically connected to the first electrode pad through a first wire that extends through the slit. The second group of connection pads is disposed on the second surface of the wiring board. The second group of connection pads is aligned adjacent to the second side surface of the slit. The second group of connection pads includes a second connection pad being electrically connected to the first connection pad through a second wire that extends over the slit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
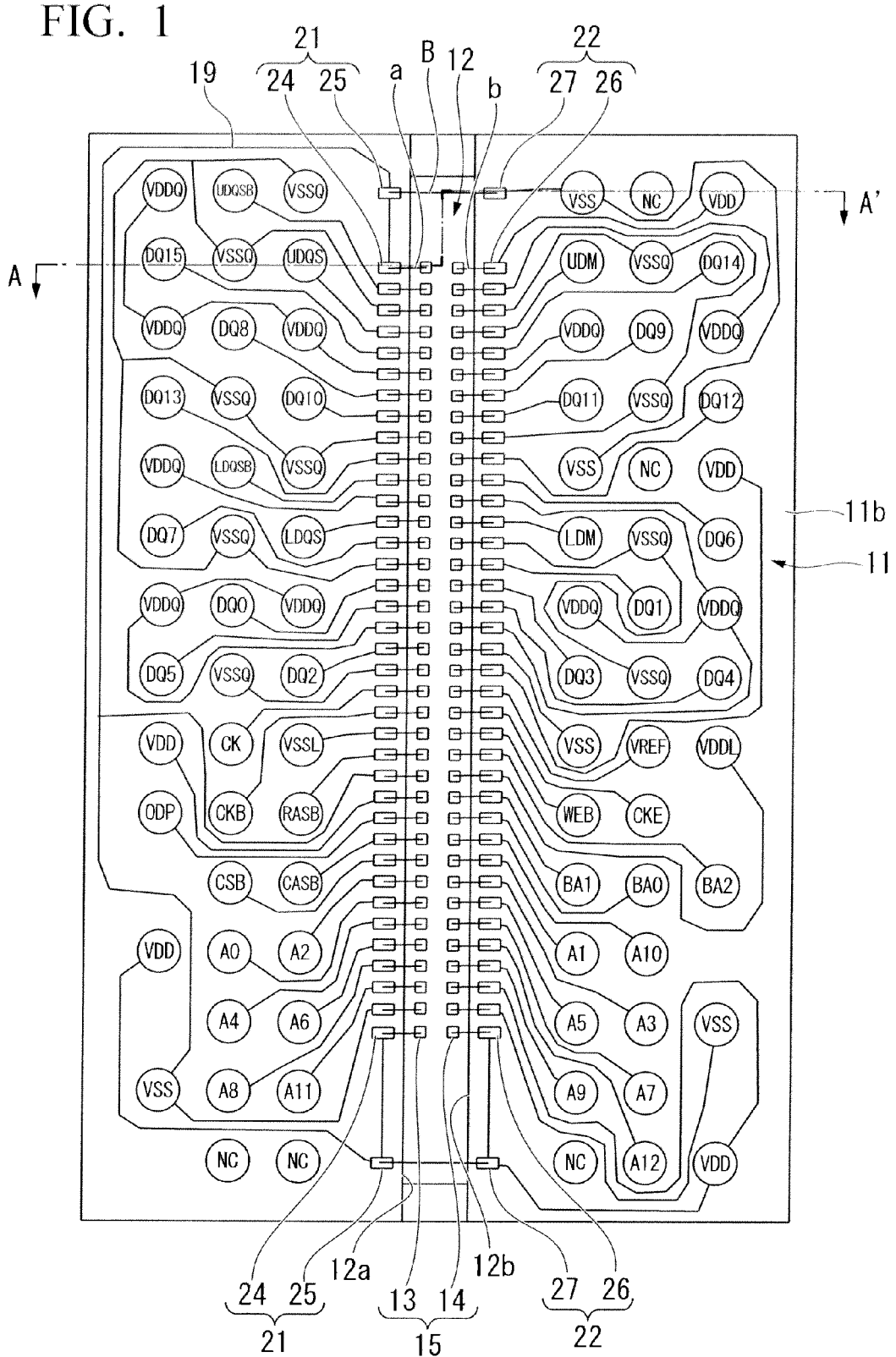
FIG. 1 is a plan view illustrating a semiconductor device according to a first embodiment of the present invention.
Figure 2:
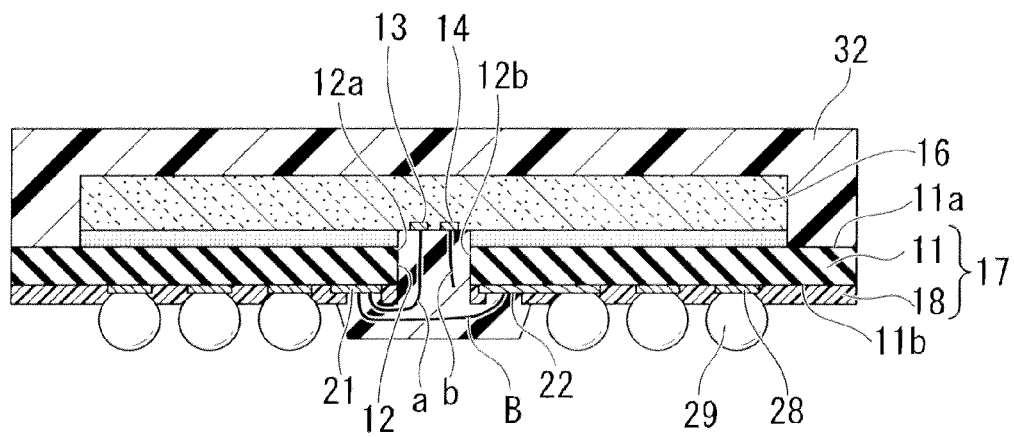
FIG. 2 is a cross-sectional view taken along line A-A' shown in FIG. 1.

FIG. 1 is a bottom plan view illustrating a BGA semiconductor device 10 according to a first embodiment of the present invention. FIG. 2 is a cross-sectional view taken along line A-A'. For simplification of explanations, a solder resist film 18 and wires B and b, which are shown in FIG. 2, are not shown in FIG. 1.

The semiconductor device 10 includes: an insulating board 11 having a through hole 12; a semiconductor chip 16 fixed to an upper surface 11a of the insulating board 11; multiple electrode pads 15 (i.e., two electrode pad columns 13 and 14) on the center region of a rear surface of the semiconductor chip 16, the electrode pad columns 13 and 14 being exposed to the hole 12; multiple connection pad groups 21 and 22 on a rear surface 11b of the insulating board 11, the connection pad groups 21 and 22 being electrically connected to the electrode pad columns 13 and 14 through multiple wires, respectively; a seal 32 covering the semiconductor chip 16 and the upper surface 11a of the insulating board 11, the seal 32 filling the hole 12 and covering the electrode pad columns 13 and 14, the connection pad groups 21 and 22, and the wires; and multiple lands (external connection terminals) 28 on the rear surface 11b of the insulating board 11.

A wiring board 17, which is substantially rectangular, includes the insulating board 11 and a wiring layer 19. The insulating board 11 is a glass epoxy board having a thickness of, for example, 0.2 mm. Wires, which are made of conductive materials such as Cu (copper), are formed on the rear surface 11b of the insulating board (glass epoxy board) 11. The wires are partially covered by an insulating film, such as a solder resist film 18. The wiring board 17 has the hole 12 in the center region thereof. The wiring board 17 is divided into two pieces by the hole 12.

The first and second connection pad groups 21 and 22, which are not covered by the solder resist film 18, are aligned on the rear surface 11b of the insulating film 11. The first connection pad group 21 is aligned along a first side surface 12a of the hole 12 which is closer to the first electrode pad line 13 than to the second electrode pad line 14. The second connection pad group 22 is aligned along the second side surface 12b of the hole 12 which is closer to the second electrode pad line 14 than to the first electrode pad line 13.

Specifically, the connection pad group 21 includes first connection pads 24 and second connection pads 25. The first connection pads 24 are connected using wires "a" to the respective electrode pads of the first electrode pad line 13. Each of the second connection pads 25 is connected to at least one of the first connection pads 24, and is not connected to the electrode pads of the first electrode pad line 13.

The second connection pad group 22 includes third connection pads 26 and fourth connection pads 27. The third connection pads 26 are connected using wires "b" to the respective electrode pads of the second electrode pad line 14. Each of the fourth connection pads 27 is connected using a wire B to the second connection pad 25, and is not connected to the electrode pads of the second electrode pad line 14.

The lands (external connection terminals) 28 are arranged in a grid on the rear surface 11b of the insulating board 11. The lands 28 are used for solder balls 29 to be mounted thereon. The connection pads (first to fourth connection pads) are electrically connected to the corresponding lands 28 using wires in the wiring layer 19.

The semiconductor chip 16, which is substantially rectangular, is fixed to the upper surface 11a of the insulating board 11 through an adhesive, such as a DAF (Die Attached Film) or an elastomer. A memory circuit and multiple electrode pads (first and second electrode pad lines 13 and 14) are formed on a rear surface of the semiconductor chip 16 which is fixed to the wiring board 17.

The first and second electrode pad lines 13 and 14 are aligned in two lines on the center region of the rear surface of the semiconductor chip 16. The first and second electrode pad lines 13 and 14 are exposed to the hole 12 of the wiring board 17. A passivation film (not shown) covers the rear surface of the semiconductor chip 16 excluding the regions of the electrode pads in order to protect the circuit formation surface.

The electrode pads of the first electrode pad line 13 are electrically connected to the respective first connection pads 24 of the first connection pad group 21 using conductive wires extending through the hole 12 of the wiring board 17. The electrode pads of the second electrode pad line 14 are electrically connected to the respective third connection pads 26 of the second connection pad group 22 using conductive wires extending through the hole 12 of the insulating board 11. The wires are made of Au, Cu, or the like.

The seal 32 covers the semiconductor chip 16 and the upper surface 11a of the insulating board 11. Further, the seal 32 fills the hole 12 and covers the center region of the rear surface 11b of the insulating board 11 so as to cover the electrode pads 13 and 14, the connection pads 21 and 22, and the wires a, b, and B. The seal 32 is made of a thermosetting resin, such as an epoxy resin. Thus, the semiconductor chip 16 and the wire connection parts are protected.

Among the connection pads on the wiring board 17, connection pads corresponding to electrode pads for power supply include the first connection pads 24, the second connection pads 25, and the fourth connection pads 27. The power supply electrode pads and the first connection pads 24 are electrically connected using wires. The second connection pad 25 and the fourth connection pad 27 are electrically connected using a wire extending over the hole 12.

According to the semiconductor device 10 having the above structure, wire routing can be simplified even if a wiring layer is formed on only one surface of an insulting board having a through hole. Additionally, the wiring layer is formed only on one surface of the insulating board, thereby reducing the cost compared to when wiring layers are formed on both surfaces of the insulating board.

Additionally, the first and second electrode pad lines 13 and 14 are aligned in two line along the first and second side surfaces 12*a* and 12*b* of the hole 12, respectively. The electrode pads of the first electrode pad line 13 are electrically connected using wires to the respective connection pads of the nearest first connection pad group 21. The electrode pads of the second electrode pad line 14 are connected using wires to the connection pads of the nearest second connection pad group 22. Accordingly, the electrode pads of the first electrode pad line 13 do not have to be connected to the connection pads of the second connection pad group 22, thereby enabling short wire-bonding, and therefore preventing a wire short circuit.

Further, the distance between the first and second connection pads 24 and 25 is larger than the distance between the adjacent first connection pads 24, thereby preventing wire short circuit. Additionally, the second connection pad 25 is electrically connected to the fourth connection pad 27 using the wire B extending over the hole 12, thereby simplifying wire routing even if the insulating board 11 is divided into two pieces by the through hole 12.

Moreover, the power supply electrode pad is electrically connected to the second connection pad 25 and the fourth connection pad 27 using wires, thereby shortening the length of the power supply wires, and therefore achieving a reduction in inductance and enhancement of the ESD (Electrostatic Discharge) resistance.

Additionally, the larger area of the second connection pads 25 of the first connection pad group 21 can be provided, thereby simplifying pad arrangement and wire routing.

Figure 3A:
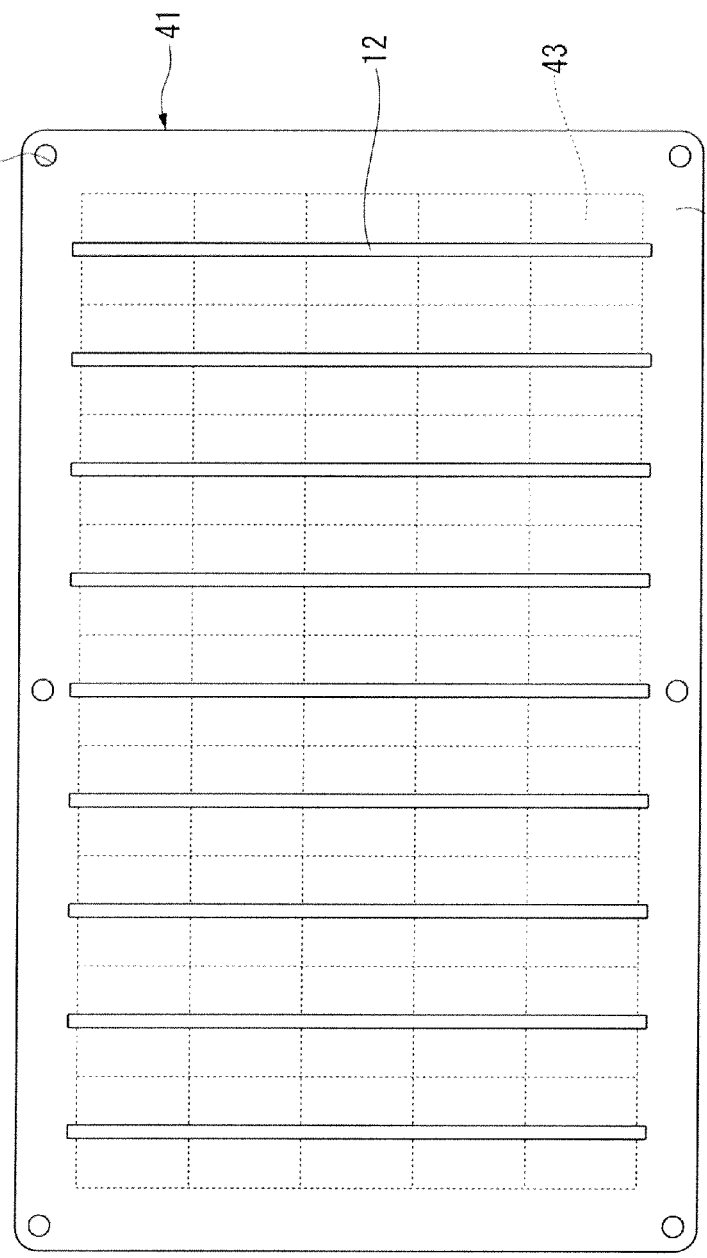
FIGS. 3A and 3B are plan and cross-sectional views illustrating a wiring motherboard used for the semiconductor device of the first embodiment.
Figure 3B:
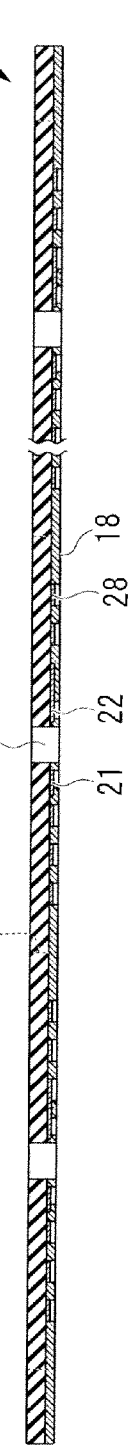

Hereinafter, a method of manufacturing the semiconductor device 10 according to the first embodiment of the present invention is explained. FIGS. 3A and 31B are a plan view and a cross-sectional view illustrating a wiring motherboard 41 used for the semiconductor device 10.

The wiring motherboard 41 is processed by an MAP (Mold Array Process) method. The wiring motherboard 41 includes multiple element formation portions 43 in a matrix. The wiring motherboard 41 has multiple holes 12 extending in the short-side direction of the wiring motherboard 41. Each element formation portion 43 is divided into two pieces by each hole 12. Each of the divided pieces becomes the aforementioned wiring board 17.

A frame 45, which surrounds the element formation portions 43, is formed. Multiple positioning holes 36, which enables easy transportation and positioning, are formed in the frame 45 at a predetermined interval. Boundaries among the element formation portions 43 are dicing lines 47. The above wiring motherboard 41 is prepared.

Figure 9:
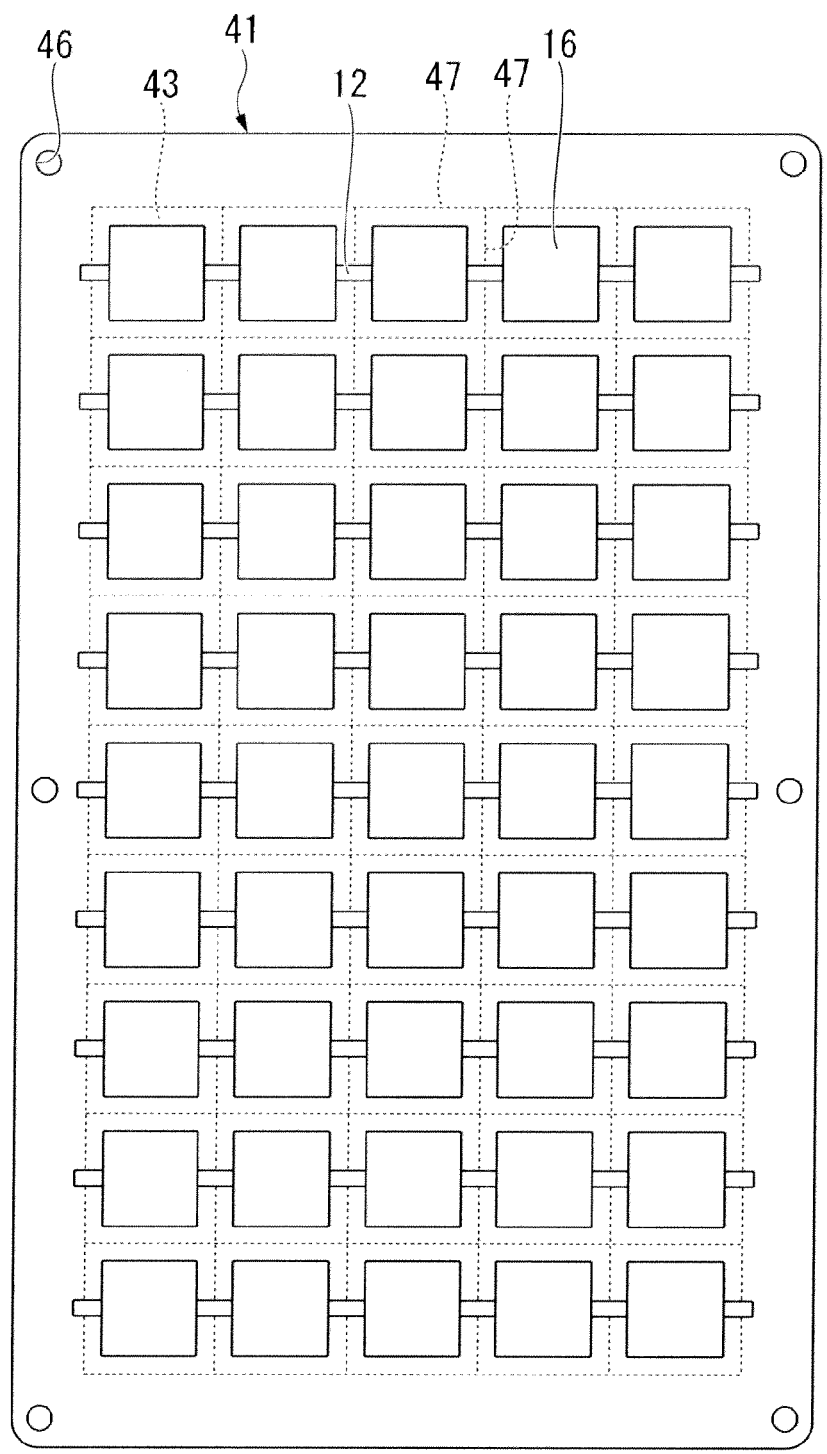
FIG. 9 is a plan view illustrating a process shown in FIG. 4.
Figure 10:
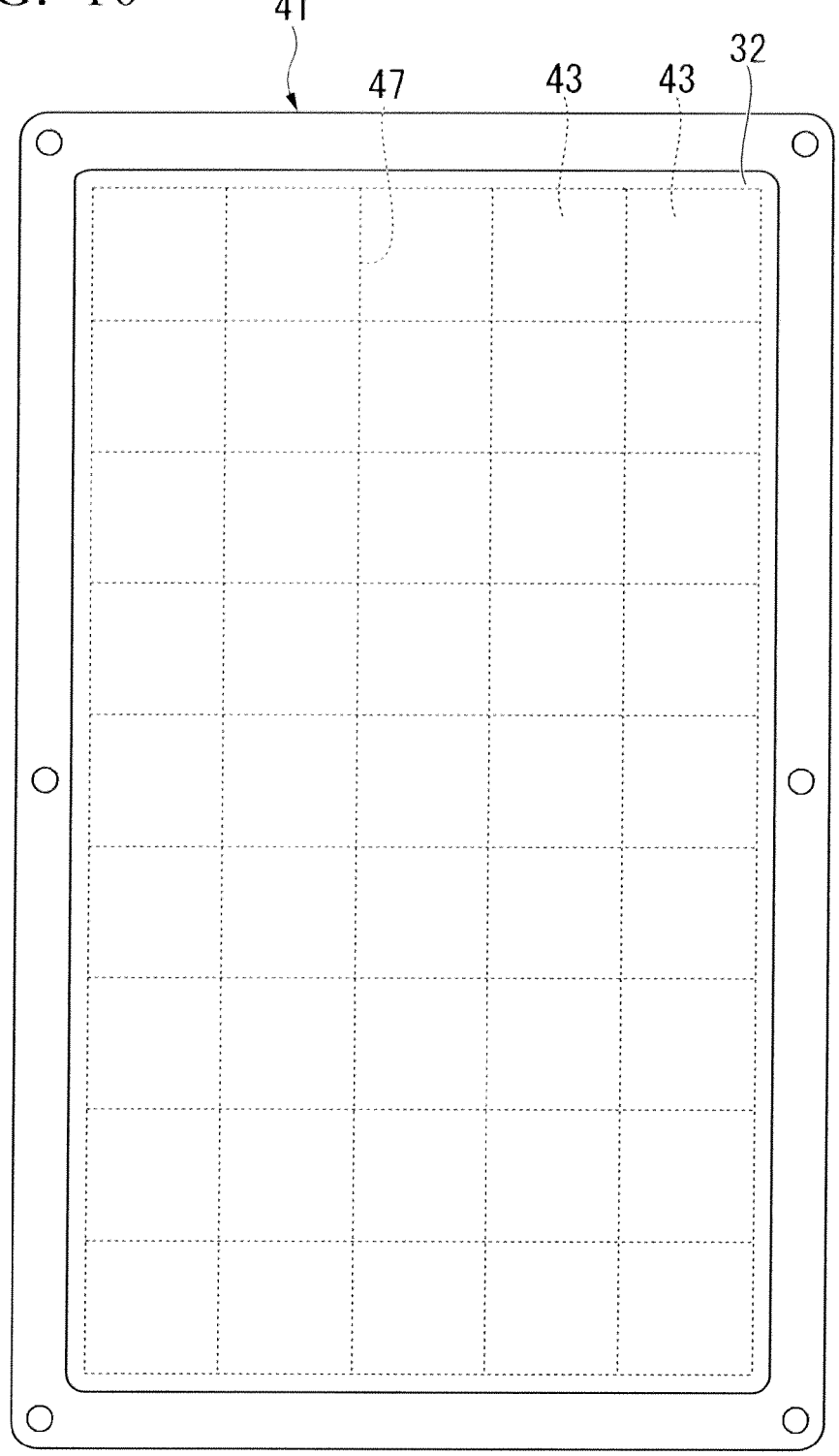
FIG. 10 is a plan view illustrating a process shown in FIG. 6.

FIGS. 4 to 8 are cross-sectional views illustrating a process flow indicative of the method of manufacturing the semiconductor device 10 according to the first embodiment. FIG. 9 is a plan view illustrating a process shown in FIG. 4. FIG. 10 is a plan view illustrating a process shown in FIG. 6. Like reference numerals denote like elements in FIGS. 1 to 10, and explanations thereof are omitted here.

Figure 4:
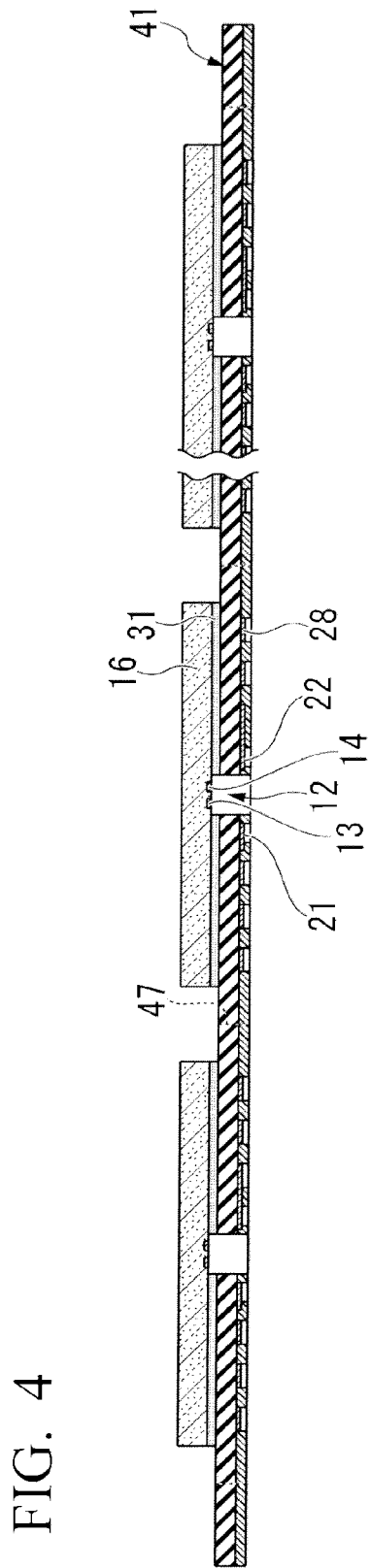
FIGS. 4 to 8 are cross-sectional views illustrating a process flow indicative of a method of manufacturing the semiconductor device according the first embodiment.

As shown in FIGS. 4 and 9, one surface of a semiconductor chip is fixed to each element formation portion 43 of the wiring motherboard 41 through a DAF, a tape member including adhesive layers on both surfaces of an insulating member, an elastic member (adhesive member 31) such as elastomer, or the like. At this time, electrode pads, which are provided on the center region of one surface of the semiconductor chip 16, are exposed to the hole 12 of the wiring board 17.

Figure 5:
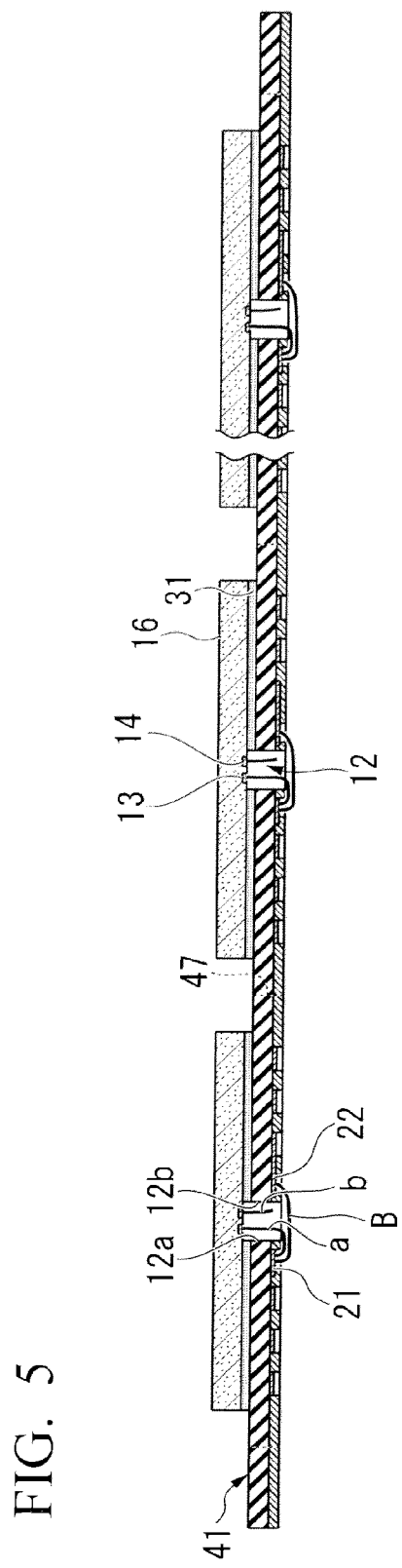

Then, as shown in FIG. 5, the electrode pads of the first electrode pad line 13 on the rear surface of the semiconductor chip 16 are connected using wires a to the first connection pads 24 of the first connection pad group 21 on the rear surface of the wiring motherboard 41. Similarly, the electrode pads of the second electrode pad line 14 on the rear surface of the semiconductor chip 16 are connected using wires b to the third connection pads 26 of the second connection pad group 22 on the rear surface of the wiring motherboard 41. Additionally, the second connection pads 25 of the first connection pad group 21 are connected to the fourth connection pads 27 of the second connection pad group 22 using wires B. The wires are made of Au or the like.

Specifically, an end portion of a wire is melted using a wire-bonding apparatus to form a ball-shaped portion. Then, the ball-shaped portion is connected by ultrasonic thermocompression to the electrode pad on the semiconductor chip 16. Then, the other end portion of the wire is connected by ultrasonic thermocompression to the corresponding connection pad.

Figure 6:
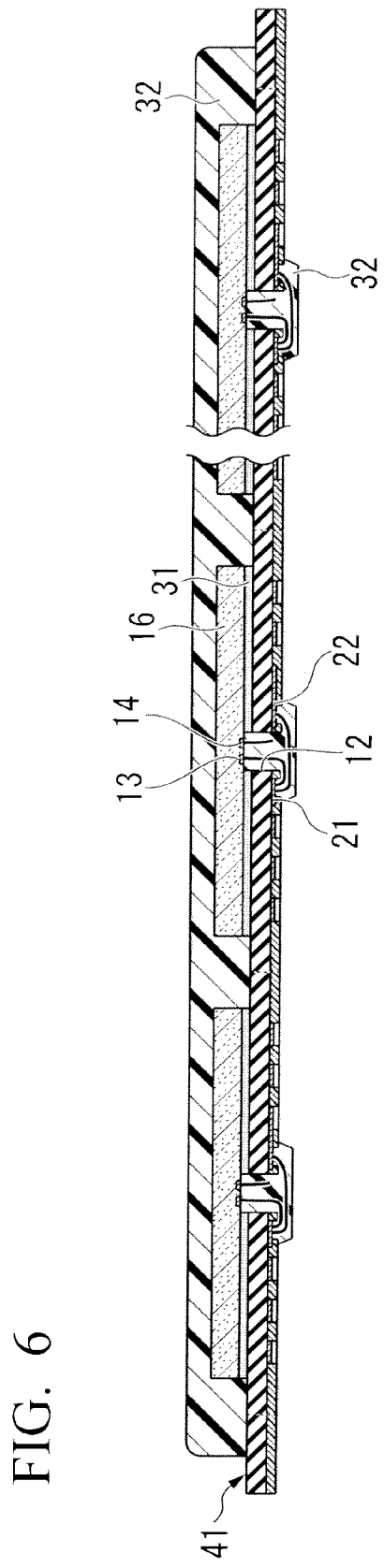

Then, in a sealing process, a seal 32, which is made of an insulating resin, is formed so as to cover the element formation portions 43 and the holes 12 of the wiring motherboard 41, as shown in FIGS. 6 and 10. Specifically, the wiring motherboard 41 is fixed onto a transfer mold apparatus including upper and lower molds. Then, a thermosetting epoxy resign is provided, by press fitting, from a gate (not shown) into a cavity formed by the upper and lower molds. After the cavity is filled with the resin, the resin is thermally-cured to form the seal covering one surface of the wiring motherboard 41 and the holes 12. Since the holes 12 extend in the short-side direction of the wiring motherboard 41 so as to divide each element formation portion 43 into two pieces, the resin can be properly provided from the gate arranged along the longitudinal side of the wiring motherboard 41.

Figure 7:
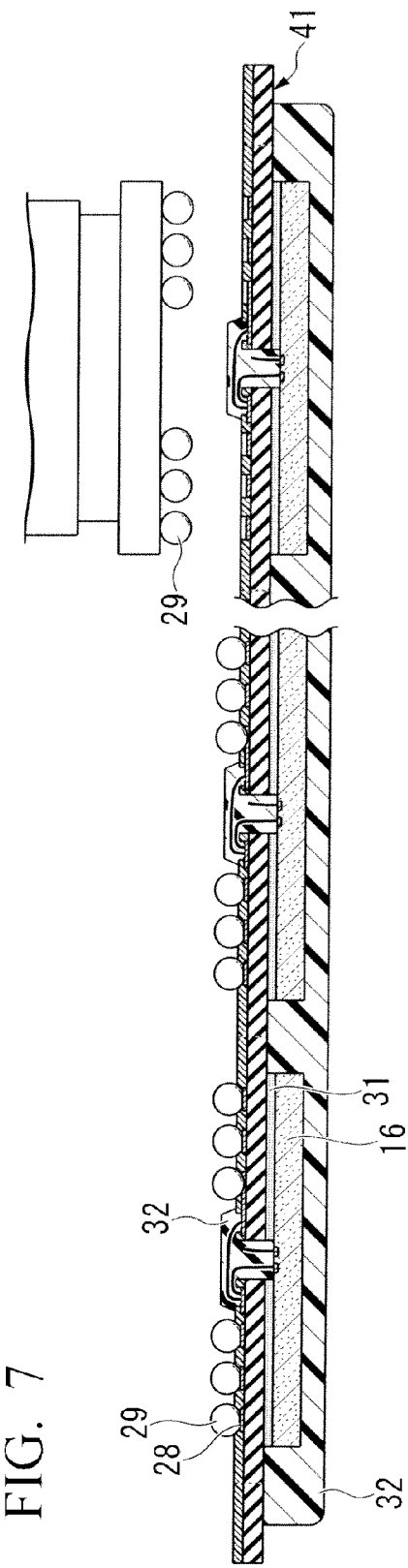

Then, in the ball-mounting process, solder balls 29, which are conductive balls, are fixed to the lands 28 arranged in a matrix on the rear surface of each element formation portion 43, as shown in FIG. 7. Specifically, the solder balls 29 are held onto suction holes of a ball mounting apparatus. The positions of the suction holes correspond to those of the lands 28 on the wiring motherboard 41. Then, a flux is applied onto the held solder balls. Then, the solder balls are collectively mounted onto the respective lands 28. Then, a reflow process is carried out at a predetermined temperature to fix the solder balls 29 onto the respective lands 28.

Figure 8:
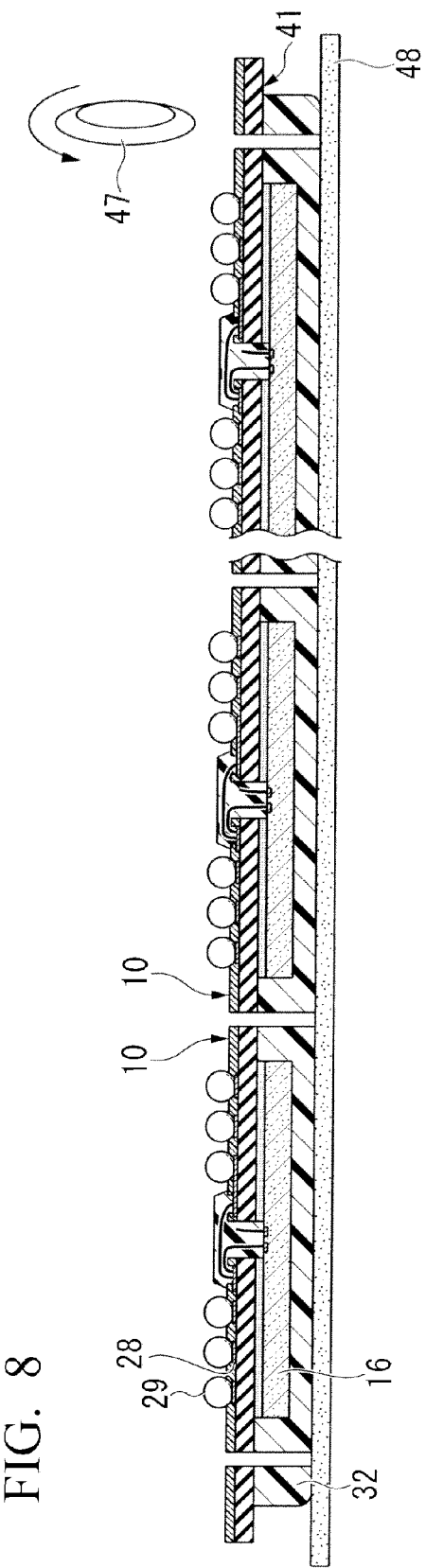

Then, in a dicing process, the wiring motherboard 41 is diced, along the dicing lines, into multiple element formation pieces, as shown in FIG. 8. Specifically, the seal 32 is fixed onto a dicing tape 48, and thus the wiring motherboard 41 is fixed by the dicing tape 48. Then, the wiring motherboard 41 is diced along the dicing lines using a dicing blade into multiple pieces. Then, each piece is removed from the dicing tape 48, and thus the semiconductor devices 10 as shown in FIGS. 1 and 2 can be obtained.

According to the manufacturing method of the first embodiment, the electrode pads of the first electrode pad line 21 (or the second electrode pad line 22) do not have to be electrically connected to the connection pads of the second connection pad group 22 (or the first connection pad group 21). Accordingly, wire-short circuit, which occurs due to flow deformation of the resin seal is prevented. Additionally, the second connection pad 25 is distanced from the first connection pad 24, and is electrically connected to the first connection pad 24 using a wire, thereby preventing a wire-short circuit.

Further, wire routing can be simplified even if the wiring layer 19 is formed on only one surface of the insulting board 11 having the through hole 12. Therefore, a semiconductor device, which includes the wiring board 17 in which the wiring layer 19 is formed on either surface of the insulating board 11, can be properly formed. Moreover, the wiring board 17 including only one wiring layer 19 can be used, thereby enabling a reduction in cost.

Second Embodiment

Figure 11:
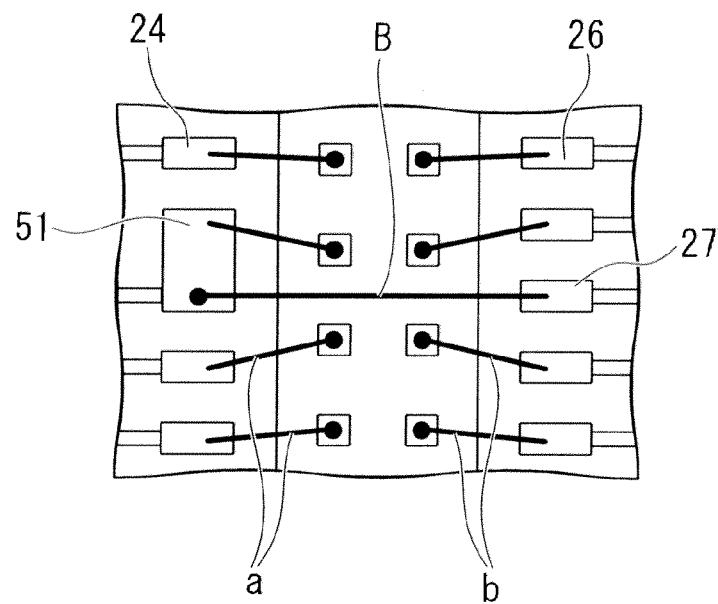
FIG. 11 is an enlarged plan view illustrating a main portion of a semiconductor device according to a second embodiment of the present invention.

FIG. 11 is a plan view illustrating a wire routing structure of a semiconductor device according to a second embodiment of the present invention. Like reference numerals denote like elements between the first and second embodiments, and explanations thereof are omitted here.

In the semiconductor device of the second embodiment, the first connection pad group 21 corresponding to power supply electrode pads are aligned on the rear surface 11b of the insulating board 11 along the nearest side surface 12a of the hole 12. The first connection pad group 21 includes the first connection pad 24 and a sheet-like wiring pattern (plane wiring pattern) 51. The plane wiring pattern 51 is formed by integrating the first and second connection pads 24 and 25.

The plane wiring pattern 51 is electrically connected to an electrode pad of the first electrode pad line 13 through a wire and to the fourth connection pad 27 through the wire B. The fourth connection pad 27 is electrically separated from any electrode pad.

According to the semiconductor device of the second embodiment, similar effects to those of the first embodiment can be obtained. The first and second connection pads 24 and 25 are integrated to form the plane wiring pattern 51, thereby enabling shorter wiring and therefore preventing wires from flowing.

Third Embodiment

Figure 12:
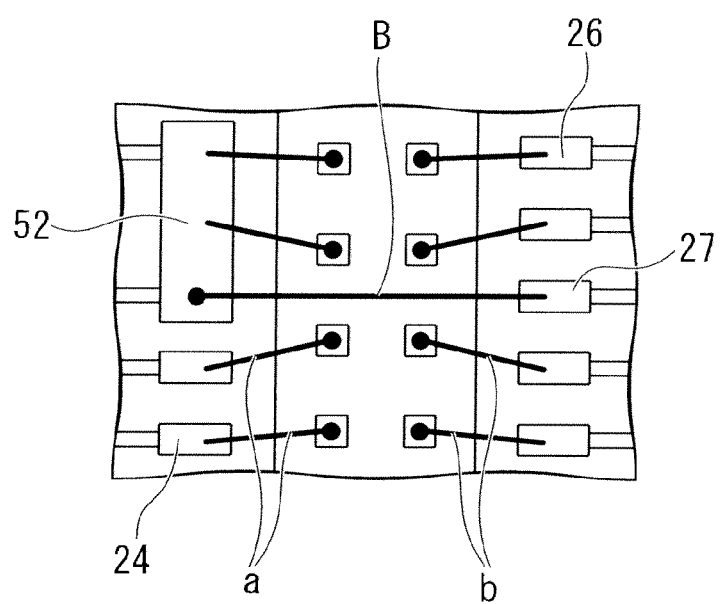
FIG. 12 is an enlarged plan view illustrating a main portion of a semiconductor device according to a third embodiment of the present invention.

FIG. 12 is a plan view illustrating a wire routing structure of a semiconductor device according to a third embodiment of the present invention. Like reference numerals denote like elements between the first and third embodiments, and explanations thereof are omitted here.

In the semiconductor device of the third embodiment, the first connection pad group 21 corresponding to power supply electrode pads are aligned on the rear surface 11b of the insulating board 11 along the nearest side surface 12a of the hole 12. The first connection pad group 21 includes the first connection pad 24 and a sheet-like wiring pattern (plane wiring pattern) 52. The plane wiring pattern 52 is formed by integrating the first and second connection pads 24 and 25.

Multiple first connection pads 24 are grouped and electrically connected to multiple power supply electrode pads using multiple wires.

The plane wiring pattern 52 is electrically connected to two electrode pads of the first electrode pad line 13 through two wires and to the fourth connection pad through the wire B.

According to the semiconductor device of the third embodiment, similar effects to those of the first embodiment can be obtained. The first and second connection pads 24 and 25 are integrated to form the plane wiring pattern 52, and the multiple first connection pads 24 are electrically connected to the multiple power supply connection pads using wires, thereby reducing the inductance compared to when the power supply electrode pads are electrically connected to the second connection pad group 22.

Fourth Embodiment

Figure 13:
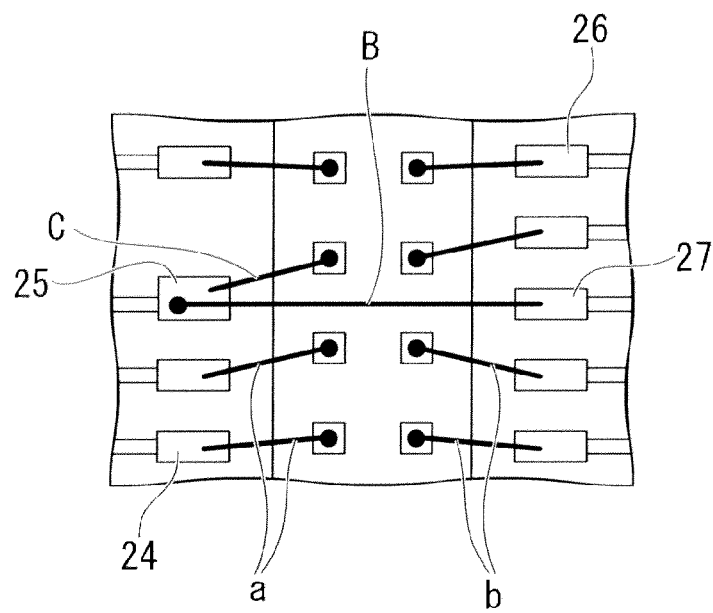
FIG. 13 is an enlarged plan view illustrating a main portion of a semiconductor device according to a fourth embodiment of the present invention.

FIG. 13 is a plan view illustrating a wire routing structure of a semiconductor device according to a fourth embodiment of the present invention. Like reference numerals denote like elements between the first and third embodiments, and explanations thereof are omitted here.

In the semiconductor device of the fourth embodiment, the first connection pad group 21 corresponding to power supply electrode pads are aligned on the rear surface 11b of the insulating board 11 along the nearest side surface 12a of the hole 12.

The semiconductor device of the fourth embodiment includes the first connection pad 24 and the second connection pad 25. The second connection pad 25 is electrically connected to an electrode pad of the first electrode pad line 13 using a wire C. Further, the second connection pad 25 is electrically connected to the fourth connection pad 27 using the wire B. In other words, the second connection pad 25 shown in FIG. 13 has the same function as that of the aforementioned connection pad 24. In the fourth embodiment, the second connection pad 25 of the fourth embodiment is formed by integrating the adjacent first and second connection pads 24 and 25 of the first embodiment.

According to the semiconductor device of the fourth embodiment, similar effects to those of the first embodiment can be obtained. The second connection pad 25 having the same function as that of the first connection pad 24 is provided, thereby enabling easy dense arrangement of connection pads. Since the wires a and B are connected to the integrated connection pad 25, the integrated connection pad 25 preferably has the larger area than other connection pads.

Fifth Embodiment

Figure 14:
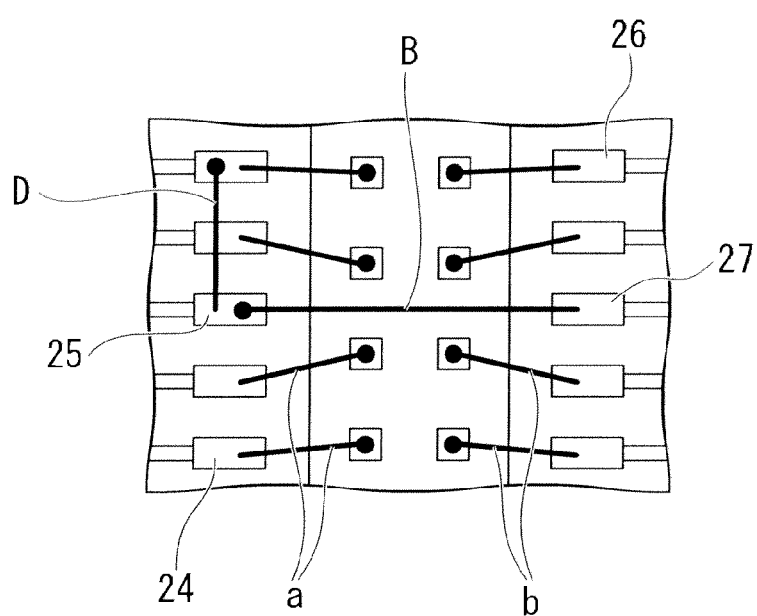
FIG. 14 is an enlarged plan view illustrating a main portion of a semiconductor device according to a fifth embodiment of the present invention.

FIG. 14 is a plan view illustrating a wire routing structure of a semiconductor device according to a fifth embodiment of the present invention. Like reference numerals denote like elements between the first and fifth embodiments, and explanations thereof are omitted here.

In the semiconductor device of the fifth embodiment, the first connection pad group 21 corresponding to power supply electrode pads are aligned on the rear surface 11b of the insulating board 11 along the nearest side surface 12a of the hole 12. The first connection pad 24 is electrically connected to an electrode pad of the first electrode pad line 13 through a wire. Further, the first connection pad 24 is electrically connected to the second connection pad 25 through a wire D. The second connection pad 25 is electrically connected to the fourth connection pad 27 through the wire B.

The first connection pad 24 is distanced from the second connection pad 25. For example, another first connection pad 24 is positioned between the first and second connection pads 24 and 25 that are electrically connected through the wire D. The another first connection pad 24 is electrically connected to an electrode pad of the first electrode pad line 13 through a wire.

According to the semiconductor device of the fifth embodiment, similar effects to those of the first embodiment can be obtained. Additionally, the second connection pad 25 can be arranged in a densely-arranged pad-region where wire routing is difficult.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified teen if this deviation would not negate the meaning of the word it modifies.

It is apparent that the present invention is not limited to the above embodiments, and may be modified and changed without departing from the scope and spirit of the invention.

For example, although it has been explained in the first to fifth embodiments that a glass epoxy board is used as the wiring board 17, a flexible wiring board made of a polyimide material may be used instead.

Although it has been explained in the first to fifth embodiments that the wiring board 17 is divided into two pieces by the hole 12, a wiring board having a hole in the center region thereof and not divided into two pieces may be used instead.

Figure 15:
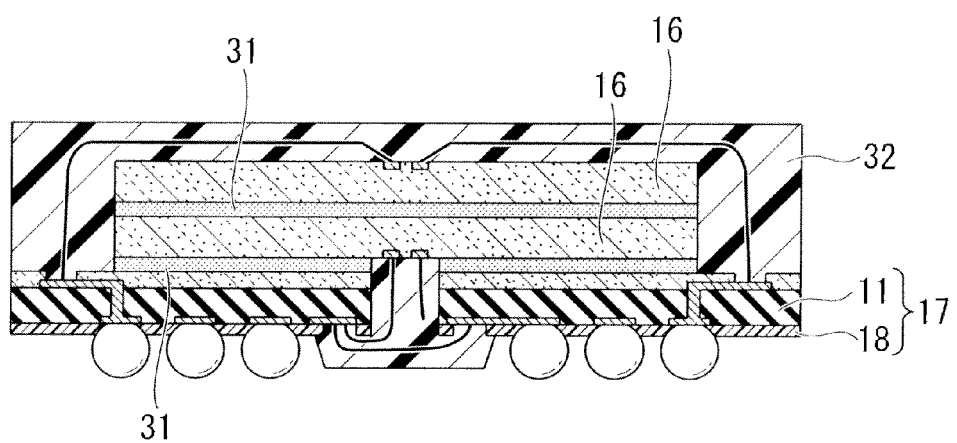
FIG. 15 is a cross-sectional view illustrating a semiconductor device according to a modified embodiment of the present invention.

Although it has been explained in the first to fifth embodiments that one semiconductor chip 16 is mounted on the wiring board 17, multiple semiconductor chips 16 may be stacked over the wiring board 17 as shown in FIG. 15.

Although it has been explained in the first to fifth embodiments that the wiring layer 19 is formed only on the rear surface 11b of the insulating board 11, a multi-layered wiring board may be used instead.

Although the case where the present invention is applied to the BGA semiconductor device 10 has been explained in the first to fifth embodiments, the present invention is applicable to an LGA (Land Grid Array) semiconductor device.

The present invention is suitable to a semiconductor device in which a semiconductor chip is fixed to an insulating board having a through hole.

What is claimed is:

1. A semiconductor device comprising:
a first wiring board having a first surface, a second surface, and a side surface, the second surface opposing the first surface;
a second wiring board separated from the first wiring board via a gap, the second wiring board having a first surface, a second surface, and a side surface, the second surface opposing the first surface, and the side surface of the second wiring board facing the side surface of the first wiring board;
a semiconductor chip fixed to the first surface of the first wiring board and the first surface of the second wiring board, the semiconductor chip having a first portion adjacent to the gap;
a first group of electrode pads on the first portion, the first group of electrode pads being aligned adjacent to the side surface of the first wiring board;
a second group of electrode pads on the first portion, the second group of electrode pads being aligned adjacent to the side surface of the second wiring board;
a first group of connection pads on the second surface of the first wiring board, the first group of connection pads being aligned adjacent to the side surface of the first wiring board; and
a second group of connection pads on the second surface of the second wiring board, the second group of connection pads being aligned adjacent to the side surface of the second wiring board,
wherein
the first group of electrode pads comprises a first electrode pad,
the first group of connection pads comprises first and second connection pads,
the first connection pad is electrically connected to the first electrode pad through a first wire that extends through the gap, without the second connection pad being directly connected to the first and second groups of electrode pads via a wire,
wherein the first connection pad is directly connected to the second connection pad through a second wire.

2. The semiconductor device according to claim 1, wherein the second connection pad is adjacent to the first connection pad.

3. The semiconductor device according to claim 2, wherein
the first group of connection pads further comprises a third connection pad adjacent to the first connection pad,
the first connection pad is positioned between the second and third connection pads, and
a first distance between the first and second connection pads is larger than a second distance between the first and third connection pads.

4. The semiconductor device according to claim 3, wherein
the first group of electrode pads further comprises a second electrode pad, and
the third connection pad is electrically connected to the second electrode pad through a third wire that extends through the gap.

5. The semiconductor device according to claim 1, wherein
the second group of connection pads comprises a fourth connection pad electrically connected to the second connection pad through a fourth wire that extends over the gap, and
the fourth connection pad is electrically separated from the first and second groups of electrode pads.

6. The semiconductor device according to claim 1, wherein the first group of electrode pads comprises a fifth electrode pad used for power supply.

7. The semiconductor device according to claim 1, further comprising:
a seal that covers at least the semiconductor chip, the first and second groups of electrode pads, and the first and second groups of connection pads.

8. The semiconductor device according to claim 1, further comprising:
a first group of external terminals on the second surface of the first wiring board, the first group of external terminals being electrically connected to the first group of connection pads; and a second group of external terminals on the second surface of the second wiring board, the second group of external terminals electrically connected to the second group of connection pads.

9. A semiconductor device comprising:
a first wiring board having a first surface, a second surface, and a side surface, the second surface opposing the first surface;
a second wiring board separated from the first wiring board via a gap, the second wiring board having a first surface, a second surface, and a side surface, the second surface opposing the first surface, and the side surface of the second wiring board facing the side surface of the first wiring board;
a semiconductor chip fixed to the first surface of the first wiring board and the first surface of the second wiring board, the semiconductor chip having a first portion adjacent to the gap;
a first group of electrode pads on the first portion, the first group of electrode pads being aligned adjacent to the side surface of the first wiring board;
a second group of electrode pads on the first portion, the second group of electrode pads being aligned adjacent to the side surface of the second wiring board;
a first group of connection pads on the second surface of the first wiring board, the first group of connection pads being aligned adjacent to the side surface of the first wiring board; and
a second group of connection pads on the second surface of the second wiring board, the second group of connection pads being aligned adjacent to the side surface of the second wiring board,
wherein
the first group of electrode pads comprises a third electrode pad,
the first group of connection pads comprises a fifth connection pad electrically connected to the third electrode pad through a fifth wire that extends through the gap, and
the second group of connection pads comprises a sixth connection pad electrically connected to the fifth connection pad through a sixth wire that extends over the gap.

10. The semiconductor device according to claim 9, wherein the sixth connection pad is electrically separated from the first and second groups of electrode pads.

11. The semiconductor device according to claim 9, wherein the first group of electrode pads further comprises a fourth electrode pad electrically connected to the fifth connection pad through a seventh wire that extends through the gap.

12. A semiconductor device comprising:
a wiring board having a center region that has a slit, the wiring board having first and second surfaces, and the slit having a first side surface and a second side surface opposing the first side surface;
a semiconductor chip fixed to the first surface of the wiring board, the semiconductor chip having a first portion adjacent to the slit;
a first group of electrode pads on the first portion, the first group of electrode pads being aligned adjacent to the first side surface of the slit, and the first group of electrode pads comprising a first electrode pad;
a second group of electrode pads on the first portion, the second group of electrode pads being aligned adjacent to the second side surface of the slit;
a first group of connection pads on the second surface of the wiring board, the first group of connection pads being aligned adjacent to the first side surface of the slit, the first group of connection pads comprising first and second connection pads, the first connection pad being electrically connected to the first electrode pad through a first wire that extends through the slit, and the second connection pad being electrically connected to the first connection pad through a wiring; and
a second group of connection pads on the second surface of the wiring board, the second group of connection pads being aligned adjacent to the second side surface of the slit,
wherein
the second group of connection pads comprises a fourth connection pad electrically connected to the second connection pad through a fourth wire that extends over the slit.

13. A semiconductor device comprising:
a wiring board having a center region that has a slit, the wiring board having first and second surfaces, the slit having a first side surface and a second side surface opposing the first side surface;
a semiconductor chip fixed to the first surface of the wiring board, the semiconductor chip having a first portion adjacent to the slit;
a first group of electrode pads on the first portion, the first group of electrode pads being aligned adjacent to the first side surface of the slit, and the first group of electrode pads comprising a first electrode pad;
a second group of electrode pads on the first portion, the second group of electrode pads being aligned adjacent to the second side surface of the slit;
a first group of connection pads on the second surface of the wiring board, the first group of connection pads being aligned adjacent to the first side surface of the slit, and the first group of connection pads comprising a first connection pad electrically connected to the first electrode pad through a first wire that extends through the slit; and
a second group of connection pads on the second surface of the wiring board, the second group of connection pads being aligned adjacent to the second side surface of the slit, and the second group of connection pads comprising a second connection pad being electrically connected to the first connection pad through a second wire that extends over the slit.

14. The semiconductor device according to claim 13, wherein
the first group of electrode pads further comprises a second electrode pad adjacent to the first electrode pad, and
the second electrode pad is electrically connected to the first connection pad through a third wire that extends through the slit.

15. The semiconductor device according to claim 13, further comprising:
a seal that covers at least the semiconductor chip, the first and second groups of electrode pads, the first and second groups of connection pads, and the first and second wires.

16. A semiconductor device comprising:
a wiring board having a center region that has a slit, the wiring board having first and second surfaces, and the slit having a first side surface and a second side surface opposing the first side surface;
a semiconductor chip fixed to the first surface of the wiring board, the semiconductor chip having a first portion adjacent to the slit;

a first group of electrode pads on the first portion, the first group of electrode pads being aligned adjacent to the first side surface of the slit, and the first group of electrode pads comprising a first electrode pad;

a second group of electrode pads on the first portion, the second group of electrode pads being aligned adjacent to the second side surface of the slit;

a first group of connection pads on the second surface of the wiring board, the first group of connection pads being aligned adjacent to the first side surface of the slit, the first group of connection pads comprising first and second connection pads, the first connection pad being electrically connected to the first electrode pad through a first wire that extends through the slit, without the second connection pad being directly connected to the first and second group of electrode pads via a wire; and a second group of connection pads on the second surface of the wiring board, the second group of connection pads being aligned adjacent to the second side surface of the slit, wherein the second connection pad is electrically connected to the first connection pad via a wiring.

17. The semiconductor device according to claim 16, wherein the first group of electrode pads further comprises a second electrode pad, the first group of connection pads further comprises a third connection pad adjacent to the first connection pad, the first connection pad is positioned between the second and third connection pads, the third connection pad is electrically connected to the second electrode pad through a third wire that extends through the slit, and a first distance between the first and second connection pads is larger than a second distance between the first and third connection pads.

18. The semiconductor device according to claim 16, further comprising:

a seal that covers at least the semiconductor chip, the first and second groups of electrode pads, the first and second groups of connection pads, and the first wire.

19. The semiconductor device according to claim 16, wherein the second group of connection pads comprises a fifth connection pad, the fifth connection pad is electrically connected to the second connection pad.

20. The semiconductor device according to claim 19, wherein the fifth connection pad is electrically connected to the second connection pad through a fifth wire that extends over the slit.

21. The semiconductor device according to claim 16, wherein the second group of connection pads comprises a sixth connection pad, the sixth connection pad is electrically connected to the first connection pad.

22. The semiconductor device according to claim 21, wherein the sixth connection pad is electrically connected to the first connection pad through a sixth wire that extends over the slit.

* * * * *